US008836566B2

(12) United States Patent
Kabir et al.

(10) Patent No.: US 8,836,566 B2
(45) Date of Patent: Sep. 16, 2014

(54) LOW POWER QUANTIZER FOR ANALOG TO DIGITAL CONVERTER

(71) Applicants: Mohammad Nizam Kabir, Tempe, AZ (US); Brandt Braswell, Chandler, AZ (US); Rakesh Shiwale, Chandler, AZ (US)

(72) Inventors: Mohammad Nizam Kabir, Tempe, AZ (US); Brandt Braswell, Chandler, AZ (US); Rakesh Shiwale, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/773,434

(22) Filed: Feb. 21, 2013

(65) Prior Publication Data

US 2014/0232579 A1    Aug. 21, 2014

(51) Int. Cl.
*H03M 1/34* (2006.01)
*H03M 1/12* (2006.01)
*H03M 99/00* (2006.01)
*H03M 3/00* (2006.01)

(52) U.S. Cl.
CPC .............. *H03M 1/12* (2013.01); *H03M 99/00* (2013.01); *H03M 3/458* (2013.01)
USPC .......................................... 341/158; 341/155

(58) Field of Classification Search
CPC ............................. H03M 1/12; H03M 3/458
USPC ........................... 341/155, 158, 159
See application file for complete search history.

(56) References Cited

U.S. PATENT DOCUMENTS

| 4,752,766 A * | 6/1988 | Shimizu et al. ............... 341/159 |
| 6,473,019 B1 | 10/2002 | Ruha et al. |
| 7,079,068 B2 | 7/2006 | Clement et al. |
| 7,397,410 B2 * | 7/2008 | Yang .............................. 341/156 |
| 7,420,497 B2 | 9/2008 | Chiu |
| 7,423,567 B2 | 9/2008 | Melanson |
| 8,305,007 B2 * | 11/2012 | Zhao ............................ 315/291 |
| 8,344,796 B2 | 1/2013 | Onishi |
| 2007/0146191 A1 * | 6/2007 | Iwata et al. .................... 341/155 |

OTHER PUBLICATIONS

Mitteregger et al., A 20-mW 640-MHz CMOS Continuous-Time Sigma Delta ADC With 20-MHz Signal Bandwidth, 80-dB Dynamic Range and 12-bit ENOB, pp. 2641-2649, IEEE Journal of Solid-State Circuits, vol. 41, No. 12, Dec. 2006.

(Continued)

*Primary Examiner* — Brian Young
(74) *Attorney, Agent, or Firm* — Schmeiser, Olsen & Watts LLP; Lowell W. Gresham; Charlene R. Jacobsen (57) ABSTRACT

A quantizer includes a voltage reference network and a set of comparators coupled with the voltage reference network. The voltage reference network generates a plurality of reference voltages. Each of the comparators receives an input signal and produces a sequence of digital samples. The set of comparators includes first, second, and third subsets of comparators. Each comparator of the first subset includes a switched capacitor stage, each comparator of the second subset includes a preamplifier stage, and each comparator of the third subset includes a switched capacitor stage. The first and third subsets of comparators compares the input signal with reference voltages corresponding to the upper and lower voltage ranges of the input signal, and the second subset of comparators compares the input signal with reference voltages corresponding to the middle voltage range of the input signal.

20 Claims, 8 Drawing Sheets

(56) References Cited

OTHER PUBLICATIONS

Dorrer et al., A 3-mW 74-dB SNR 2-MHz Continuous-Time Delta-Sigma ADC With a Tracking ADC Quantizer in .13 Micron CMOS, pp. 2416-2427, IEEE Journal of Solid-State Circuits, vol. 40, No. 12, Dec. 2005.

Mohammad Ranjbar, A 3.1 mW Continuous-Time Sigma Delta Modulator With 5-Bit Successive Approximation Quantizer for WCDMA, pp. 1479-1491, IEEE Journal of Solid-State Circuits, vol. 45, No. 8, Aug. 2010.

* cited by examiner

PRIOR ART

FIG. 3

PRIOR ART

LOW POWER QUANTIZER FOR ANALOG TO DIGITAL CONVERTER

TECHNICAL FIELD OF THE INVENTION

The present invention relates generally to analog-to-digital converters. More specifically, the present invention relates to a low power consumption quantizer for implementation in an analog-to-digital converter.

BACKGROUND OF THE INVENTION

Delta-sigma modulation techniques are often used in analog-to-digital converters (ADCs) and in digital-to-analog converters (DACs). Delta-sigma converters can convert signals over a wide range of frequencies with high resolution results. They can provide linear behavior and relatively straightforward implementation due to the reduced number of bits used in the analog signal comparison. Additionally, delta-sigma ADCs can be implemented with a high level of control of the frequency distribution of "quantization noise," which is the difference between the ideal output value of the converter as determined by the input signal and the actual output of the converter provided by a quantizer. The relative simplicity of the architecture and the ability to control the quantization noise makes delta-sigma converter implementations a desirable option.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

A continuous-time (CT) sigma delta analog-to-digital converter (ADC) typically includes a loop filter that receives an input signal and a quantizer that converts the output of the loop filter to a digital representation. Present-day CT sigma delta ADCs typically use multi-bit designs, in which the output of the quantizer is a multi-level signal. The multi-bit implementation provides for improved noise shaping capability and linearity of the converter and generally reduces the linearity and slew-rate requirements of the analog components in the loop filter. Therefore, multi-bit topologies are very desirable. A drawback of a multi-bit quantizer is that it consumes a significant portion of the total power consumed by a CT sigma delta ADC. Indeed, in a multi-bit quantizer solution, the power consumption of the quantizer is doubled for every additional bit because each extra bit calls for doubling the number of comparators in such a quantizer.

There is a continual need for electronic devices that have reduced power consumption. Additionally, there is an increasing trend for electronic devices to perform processing in the digital domain. Accordingly, there is an increasing demand for high resolution, low power, and inexpensive ADCs, such as a CT sigma delta ADC that incorporates a multi-bit quantizer design.

Embodiments described herein include a low power quantizer, a CT sigma delta ADC with the quantizer implemented therein, and a method of performing analog-to-digital conversion using the quantizer. The quantizer and/or a CT sigma delta ADC that includes the quantizer may be implemented in a variety of devices, such as, for example, wireless devices (including transmitters and receivers), computer communication systems, radar, flash ADC designs, or any other highly integrated electrical circuit.

Figure 1:
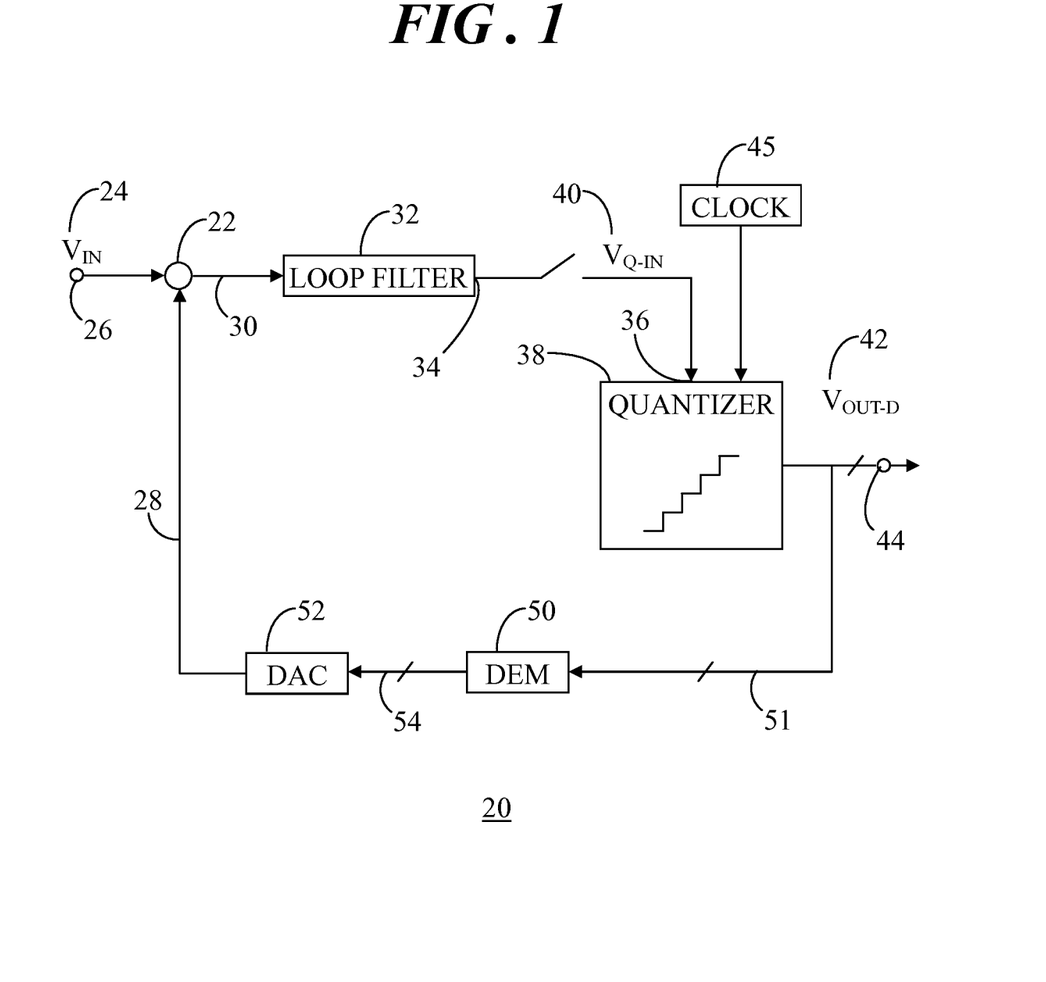
FIG. 1 shows a simplified block diagram of continuous-time (CT) sigma delta analog-to-digital converter (ADC), according to an example embodiment.

FIG. 1 shows a simplified block diagram of continuous-time (CT) sigma delta analog-to-digital converter (ADC) 20, according to an example embodiment. In general, CT sigma delta ADC 20 includes a summing element 22 that sums an analog input signal 24, $V_{IN}$, received at an input node 26 with a negative feedback signal on a conductor 28 and applies the summation result via a conductor 30 to the input of a linear loop filter 32. An output 34 of loop filter 32 is selectively coupled to an input 36 of a multi-bit quantizer 38.

Quantizer 38 receives a filtered input signal 40, $V_{Q-N}$, from loop filter 32, where input signal 40 is representative of the analog input signal 24. Quantizer 38 subsequently converts the analog input signal 40 into a sequence of digital samples 42, $V_{OUT\text{-}D}$ (i.e., a quantized, discrete, multi-bit output) and provides the digital samples 42 at an output node 44. Digital samples 42 are produced at a sample rate that is determined by the frequency of a clock signal provided by clock 45. The sequence of digital samples 42 is representative of the amplitude of input signal 24 at various sampling times. The number of output bits of digital samples 42 can be any number depending, at least in part, on the desired resolution.

In an exemplary configuration, the frequency of the clock signal may be in a range of about two hundred to about four hundred megahertz (e.g., 320 MHz), although higher or lower clock frequencies may be used as well. The frequency of the clock signal results in the production of an oversampled sequence of digital samples at an output of quantizer 38, and in which the quantization noise is spread over a wider band than it would be if the sampling rate were slower. The exemplary clock frequency is not meant to limit application of the inventive subject matter to quantizers operating at the aforementioned clock frequency, as the embodiments may be incorporated in faster or slower quantizers as well.

An output of quantizer 38 may be applied to an input of a dynamic element matching (DEM) circuit 50 (e.g., conveyed over conductor(s) 51). There are several well known DEM circuit topologies which may be used for DEM circuit 50, and these DEM circuit topologies function to remove the effect of mismatch between feedback elements of a feedback digital-to-analog converter (DAC) 52. Output conductor(s) 54 of DEM circuit 50 are coupled to an input of DAC 52, the output of which produces the above mentioned negative feedback signal on conductor 28.

Figure 2:
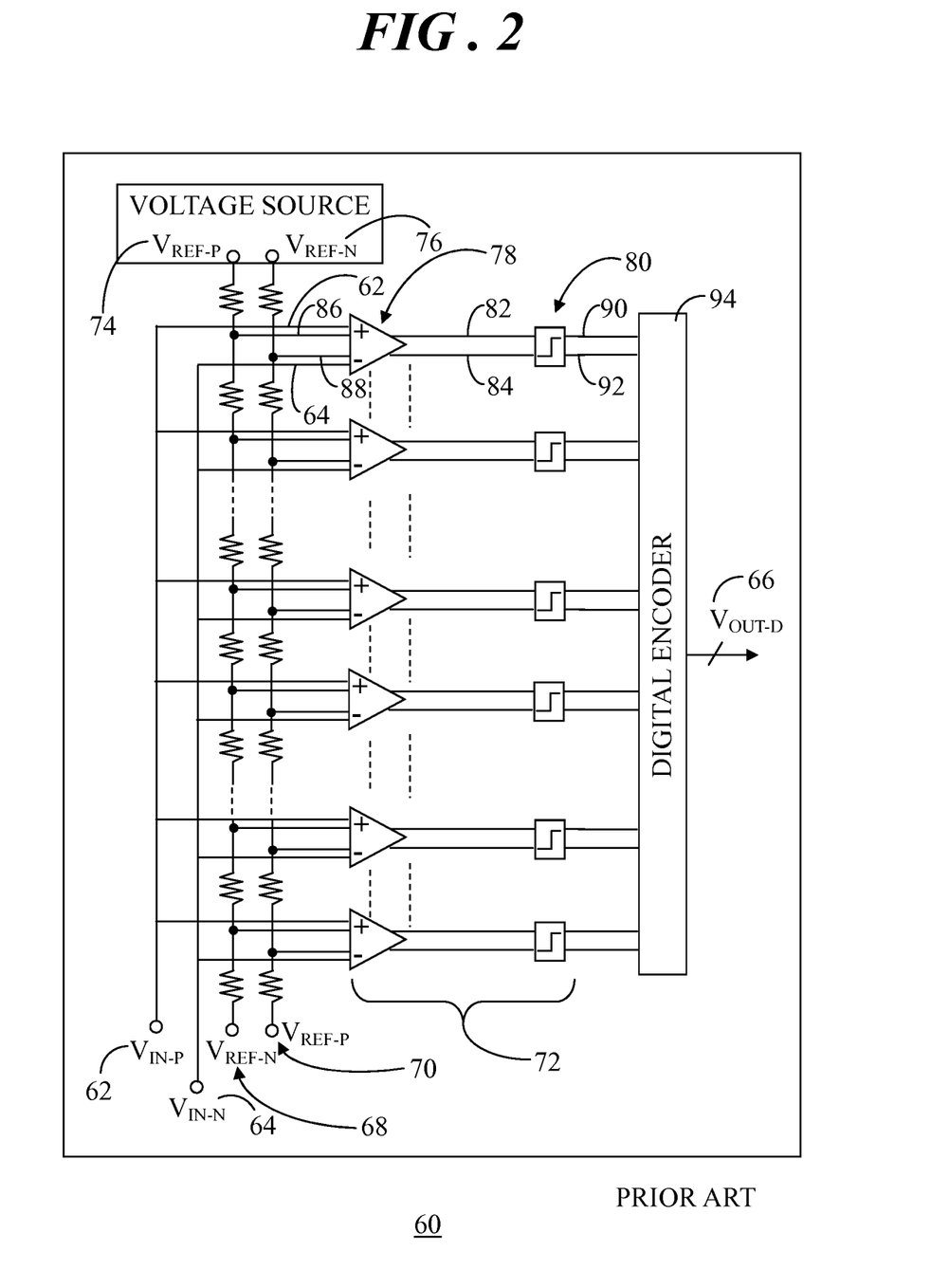
FIG. 2 shows a simplified schematic of a prior art quantizer that may be implemented in a CT sigma delta ADC.

FIG. 2 shows a simplified schematic of a prior art quantizer 60 that may be implemented in a CT sigma delta ADC, such as the exemplary CT sigma delta ADC 20 presented in FIG. 1. Prior art quantizer 60 is provided herein to illustrate problems that may occur in prior art quantizer designs that can be surmounted with embodiments of the present invention.

In this example, prior art quantizer 60 is a differential circuit configured to receive a positive analog input signal 62, $V_{IN-P}$, and a negative input signal 64, $V_{IN-N}$, at an input for conversion to a digital value 66, $V_{OUT-D}$, at an output. Quantizer 60 includes at least one voltage reference network 68, 70 and a set of matched comparators 72. In this example, voltage reference network 68, 70 is a resistive ladder network (i.e., a series of matched resistors). As such, the voltage reference network will be referred to hereinafter as resistive ladder network 68, 70. However, those skilled in the art will recognize that other voltage reference network designs may be implemented such as, for example, a capacitive reference network. In general, during operation, positive and negative reference voltages 74, 76 are dropped across the series of matched resistors of voltage reference network 68, 70, while input signals 62, 64 vary. Based on this variation, a varying number of comparators 72 are turned on/off over a given period of time.

Each of comparators 72 includes two primary elements, a preamplifier stage 78 that is configured to amplify input signals 62, 64 received at comparator 72, and a latch stage 80. Prior art quantizer 60 is shown with six comparators 72, and their associated preamplifier stage 78 and latch stage 80, for illustrative purposes. It should be readily understood that quantizer 60 may include more than or fewer than six comparators 72, as represented by vertical dashed lines interposed between preamplifier stages 78. In this prior art embodiment, preamplifier stage 78 has a differential input so that a positive and negative outputs 82, 84 of preamplifier stage 78 are proportional to the differences between positive and negative reference voltages 86, 88 and input signals 62, 64.

Latch stage 80 for each of comparators 72 provides a latching function, whereby all preamplifiers outputs 82, 84 above a predetermined level produce a digital "1" at outputs 90, 92 of latch stage 80. Output signals from outputs 90, 92 of latch stage 80 are encoded at a digital encoder 94 to produce digital value 66, i.e., a sequence of digital samples. Latch stage 80 is clocked, that is, it performs its latching function only when commanded by an external clock, e.g., clock 45 (FIG. 1). This ensures that the output, i.e., digital value 66, of quantizer 60 is a data stream sampled at the clock frequency.

Preamplifier stage 78 for each of comparators 72 has high gain. The combination of high gain and latching ensures that input signals 62, 64 to preamplifier stage 78 need be only a very small amount above reference voltages 86, 88 to make the output of comparator 72 a digital "1." Additionally, preamplifier stage 78 typically has a very high bandwidth with small open loop gain. Thus, the use of multiple preamplifier stages 78 in a set of comparators 72 might satisfy signal-to-noise ratio (SNR) and signal-to-noise-and-distortion ratio (SNDR) performance requirements. Unfortunately, however, preamplifier stage 78 consumes static power (i.e., the constant power that is being consumed continuously from the power supply) which is the major portion of the power consumed in a very high speed quantizer (e.g., 320 MHz). This high power consumption can be exacerbated in systems and devices that include more than one quantizer. Furthermore, preamplifier based comparators can suffer from a voltage headroom problem where the transistor does not have enough voltage to stay in saturation and slowly goes into the triode region as the input voltage increases, thereby resulting in signal distortion at upper and lower voltage ranges.

Figure 3:
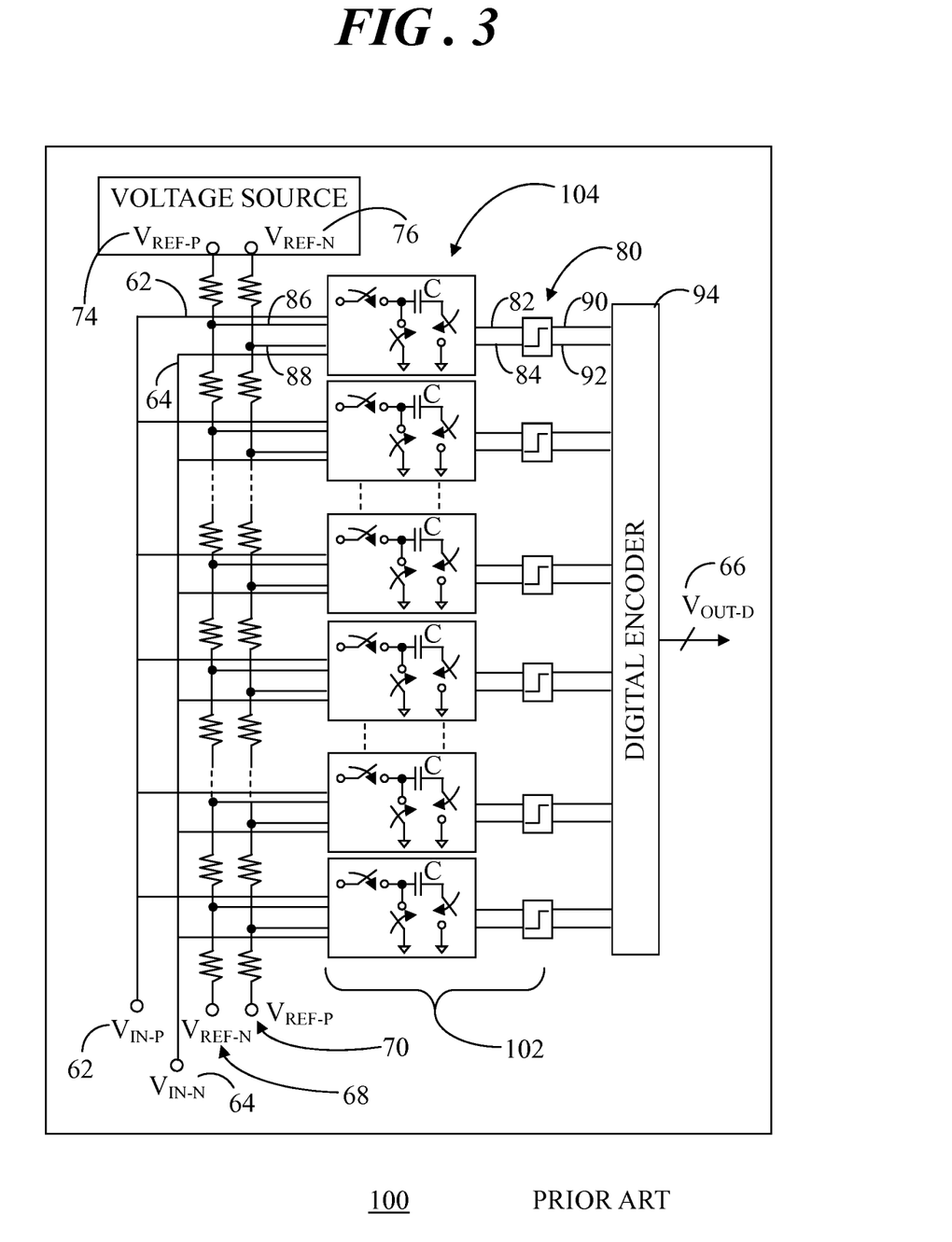
FIG. 3 shows a simplified schematic of another prior art quantizer that may be implemented in a CT sigma delta ADC.

FIG. 3 shows a simplified schematic of another prior art quantizer 100 that may be implemented in a CT sigma delta ADC, such as the exemplary CT sigma delta ADC 20 presented in FIG. 1. Again, prior art quantizer 100 is provided herein to illustrate problems that may occur in other prior art quantizer designs that can be surmounted with embodiments of the present invention. Prior art quantizer 100 differs from quantizer 60 (FIG. 2) in that a set of comparators 102 includes a switched capacitor stage 104 in lieu of preamplifier stage 78 (FIG. 2) included in comparators 72 (FIG. 2).

Switched capacitor stage 104 is a circuit element sometimes used in quantizers where savings in power consumption is required. In particular, switched capacitor based quantizers, such as prior art quantizer 100 do not consume static current. Reduced power consumption of switched capacitor stage 104 is effective in reducing the power consumption of the overall system. Unfortunately, however, the reduction in power consumption and the performance of switched capacitor stage 104 are in a tradeoff relationship. That is, switched capacitor based comparators 102 suffer from higher kickback noise, clock feed-through, and charge injection.

Kickback noise is switching noise that is coupled back from the output to the input. In the case of quantizer 100, whenever the output of latch 80 changes, this output can couple back to the input, which can significantly disturb the input. Clock feed-through refers to the condition in which the clock input gets coupled to the output whenever a clock input is applied to the transmission gate which is being used as a switch in a switch capacitor based circuit. Charge injection refers to the condition in which the charge present in the transistor's channel is drawn towards the source and the drain whenever the transistor switch changes its state from ON to OFF or vice versa. Accordingly, although switched capacitor based comparators 102 may satisfy power consumption requirements, they are not as accurate as the preamplifier based comparators (e.g., comparators 72 of FIG. 2). Thus, quantizers that employ switched capacitor based comparators 102 may not satisfy stringent SNR and SNDR performance requirements.

Figure 4:
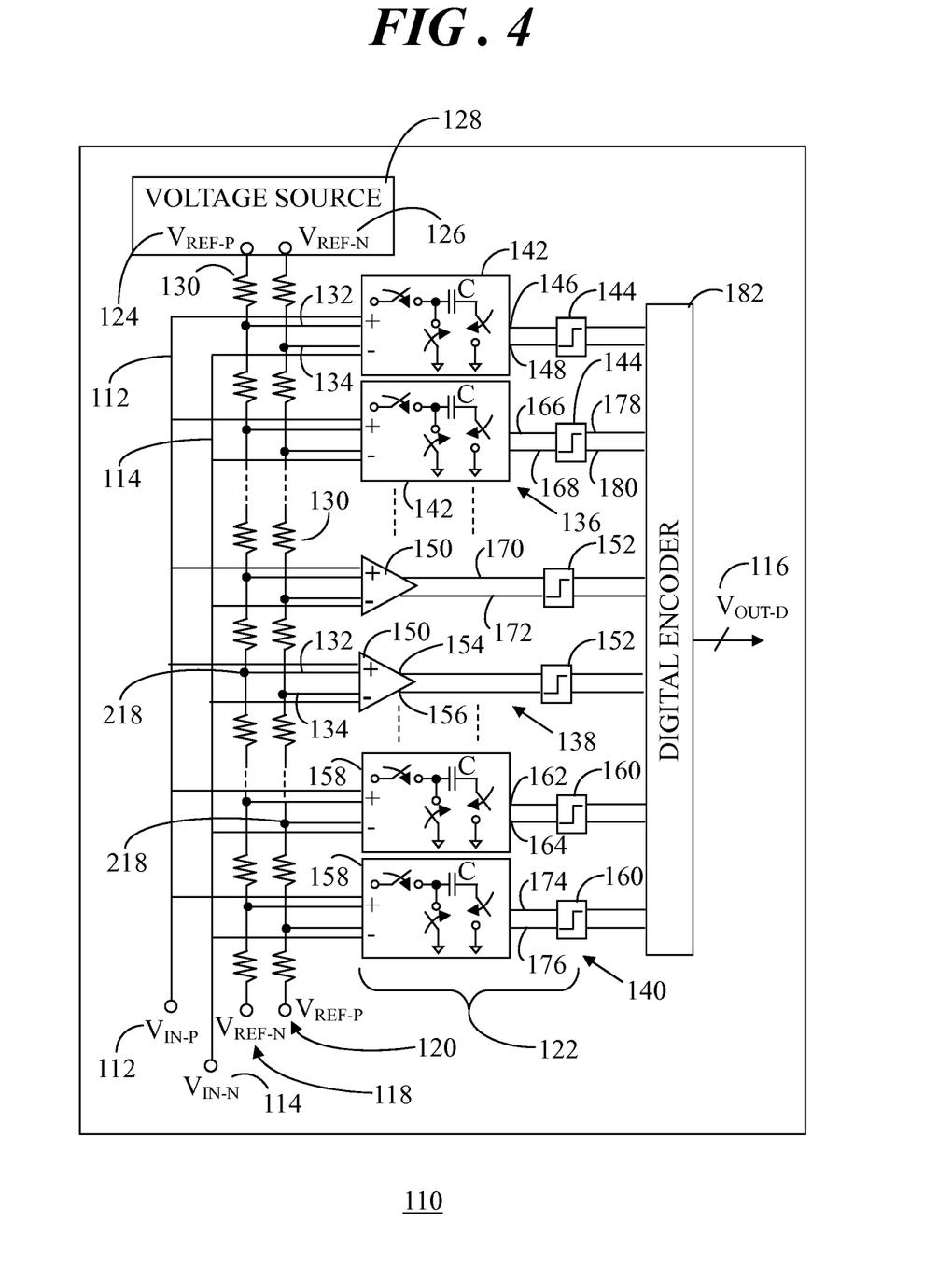
FIG. 4 shows a simplified schematic of a quantizer, according to an exemplary embodiment.

Referring now to FIG. 4, FIG. 4 shows a simplified schematic of a quantizer 110 that may be implemented in a CT sigma delta ADC (e.g., CT sigma delta ADC 20 presented in FIG. 1), according to an exemplary embodiment. Quantizer 110 incorporates an optimized use of preamplifier based comparators and switched capacitor based comparators to yield a system that meets SNR and SNDR performance requirements, while achieving savings in power consumption relative to prior art high accuracy quantizer designs.

Quantizer 110 is a differential circuit configured to receive analog input signals 112, 114, $V_{IN-P}$ and $V_{IN-N}$, at an input for conversion to a digital value 116, $V_{OUT-D}$, at an output. Quantizer 110 includes at least one voltage reference network 118, 120 and a set of comparators 122. Again, voltage reference network 118, 120 is represented by a resistive ladder network. Thus, elements 118 and 120 will be referred to hereinafter as resistive ladder networks 118 and 120. However, those skilled in the art will recognize that other voltage reference network designs such as, for example, a capacitor ladder network, may be implemented herein. During operation, input positive and negative reference voltages 124, 126 provided by a voltage source 128 are dropped across a series of matched resistors 130 of resistive ladder network 118, 120 to generate a plurality of positive and negative reference voltages 132, 134.

Based on the variation of input signals 112, 114 relative to the various reference voltages 132, 134, a varying number of comparators 122 are turned on/off over a given period of time. The term "matched" is used herein to refer to a condition in which each element of a group is generally identical.

In contrast to the preamplifier based comparators used in some prior art quantizers (discussed in connection with FIG. 2), and in contrast to switched capacitor based comparators used in other prior art quantizers (discussed in connection with FIG. 3), set of comparators 122 is subdivided into subgroups or subsets. In particular, set of comparators 122 includes a first subset of comparators 136, a second subset of comparators 138, and a third subset of comparators 140. The terms "first," "second," "third," and so forth used herein do not refer to an ordering or prioritization of elements within a countable series of elements. Rather, the terms "first," "second," "third," and so forth are used to distinguish certain elements, or groups of elements, from one another for clarity of discussion.

Each comparator 122 of first subset 136 includes a first switched capacitor stage 142 and a first latch stage 144 coupled to outputs 146, 148 of its associated first switched capacitor stage 142. Each comparator 122 of second subset 138 includes a preamplifier stage 150 and a second latch stage 152 coupled to outputs 154, 156 of its associated preamplifier stage 150. And, each comparator 122 of third subset 140 includes a second switched capacitor stage 158 and a third latch stage 160 coupled to outputs 162, 164 of its associated second switched stage 158.

In an embodiment, first switched capacitor stage 142 and second switched capacitor stage 158 are matched (i.e., generally identical) circuit elements. Likewise, first, second, and third latch stages 144, 152, and 160 are matched (i.e., generally identical). Quantizer 110 is shown with six comparators 122 for illustrative purposes. In other embodiments, quantizer 110 may include more than or fewer than six comparators 122 (as represented by vertical dashed lines interposed between first and second subsets 136 and 138 as well as between second and third subsets 138 and 140) depending upon the number of bits, SNR/SNDR, and power consumption requirements.

In this embodiment, each of first switched capacitor stage 142, preamplifier stage 150, and second switched capacitor stage 158 has a differential input. Therefore, first positive and negative output signals 166, 168 of each first switched capacitor stage 142 are proportional to the differences between their respective positive and negative reference voltages 132, 134 and input signals 112, 114. Likewise, second positive and negative output signals 170, 172 of each preamplifier stage 150 are proportional to the differences between their respective positive and negative reference voltages 132, 134 and input signals 112, 114. Furthermore, third positive and negative output signals 174, 176 of each second switched capacitor stage 158 are proportional to the differences between their respective positive and negative reference inputs 132, 134 and input signals 112, 114.

First latch stage 144 for each of comparators 122 of first subset 136 is configured to perform a latching operation on first output signals 166, 168 from outputs 146, 148 of first switched capacitor stage 142. Second latch stage 152 for each of comparators 122 of second subset 138 is also configured to perform the latching operation on second output signals 170, 172 from outputs 154, 156 of preamplifier stage 150. In addition, third latch stage 160 for each of comparators 122 of third subset 140 is configured to perform the latching operation on third output signals 174, 176 from outputs 162, 164 of second switched capacitor stage 158. In accordance with the latching function, all of the output signals 166, 168, 170, 172, 174, and 176 above a predetermined level produce a digital "1" at latch outputs 178, 180 of their associated first, second, and third latch stages 144, 152, and 160, respectively. The output signals at latch outputs 178, 180 of latch latches 144, 152, and 160 are encoded at a digital encoder 182 to produce digital value 116, i.e., a parallel or serial sequence of multi-bit digital samples.

Figure 5:
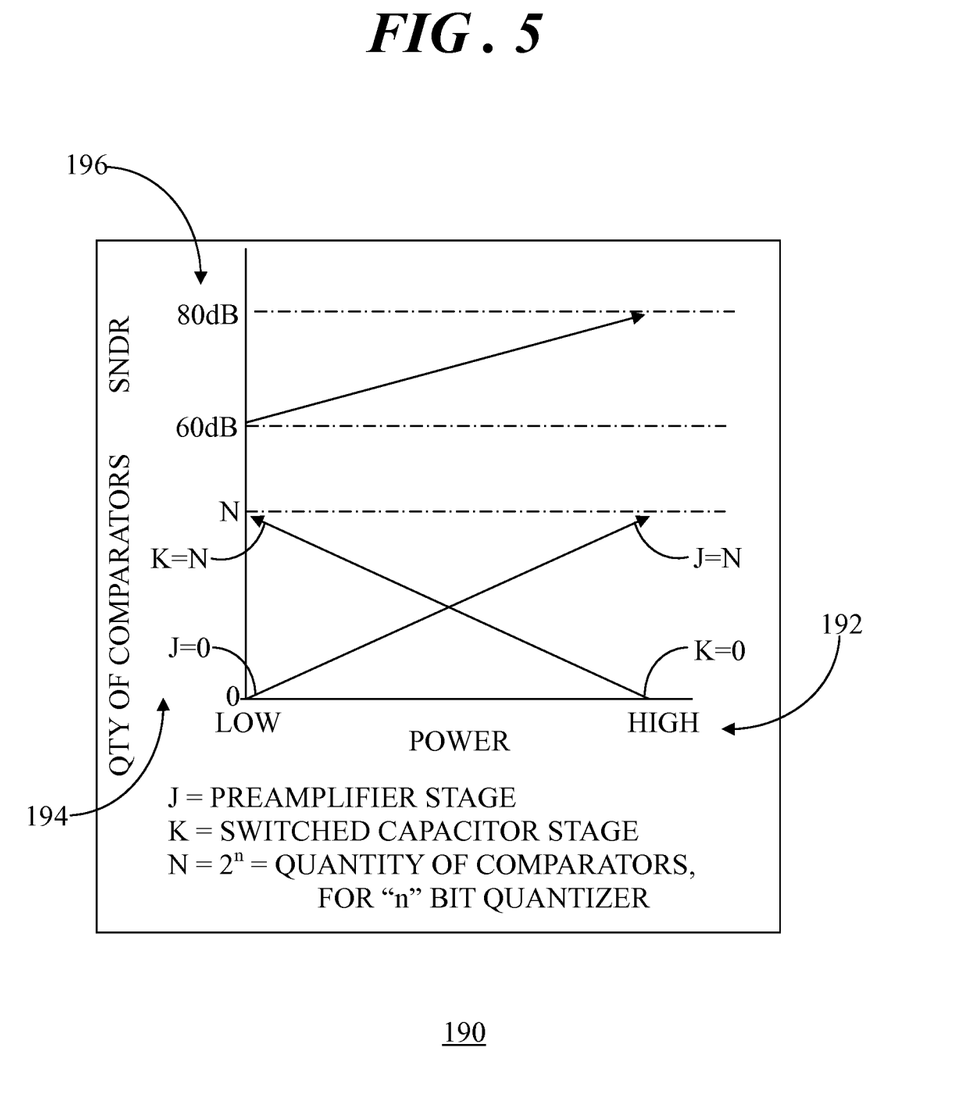
FIG. 5 shows a chart exemplifying power consumption and noise tradeoffs between comparators implemented within the quantizer of FIG. 4.

FIG. 5 shows a chart 190 exemplifying power consumption and noise tradeoffs between a combination of preamplifier based comparators and switched capacitor based comparators implemented within a quantizer, e.g., quantizer 110 (FIG. 4). In particular, the horizontal axis of chart 190 shows power consumption 192 increasing from left to right. The vertical axis of chart 190 represents a quantity 194 of comparators increasing vertically from zero to N comparators. In this example, N=$2^n$, where quantity 194 of comparators is determined for an "n" bit quantizer. The vertical axis of chart 190 also represents a measure of noise, more particularly, a signal-to-noise-and-distortion ratio (SNDR) 196, increasing vertically from sixty decibels (60 dB) to eighty decibels (80 dB). The letter "J" represents a higher accuracy, higher power consumption preamplifier based comparator (for example, comparators 122 within subset 138 shown in FIG. 4). Whereas, the letter "K" represents a lower accuracy, lower power consumption switched capacitor based comparator (for example, comparators 122 within subsets 136 and 140 shown in FIG. 4). It should be understood that the SNDR requirements are not limited from 60-80 dB. Rather the SNDR requirements can be higher, depending upon particular design requirements.

In general, chart 190 reveals that in quantizer 110 (FIG. 4) having a predetermined quantity 194, N, of comparators, as the quantity of higher accuracy, higher power consumption preamplifier based comparators (J) increases from 0 to N and the quantity of lower accuracy, lower power consumption switched capacitor based comparators (K) correspondingly decreases from N to 0, SNDR 196 advantageously increases. However, power consumption 192 also increases. Conversely, chart 190 reveals that when the quantity of lower accuracy, lower power consumption switched capacitor based comparators (K) increases from 0 to N and the quantity of higher accuracy, higher power consumption preamplifier based comparators (J) correspondingly decreases from N to 0, power consumption 192 decreases. However, SNDR 196 also decreases. Embodiments entail an optimized configuration of the higher accuracy, higher power consumption preamplifier based comparators (J) and the lower accuracy, lower power consumption switched capacitor based comparators (K) to achieve the desired SNDR 196 and optimize power consumption 196.

Figure 6:
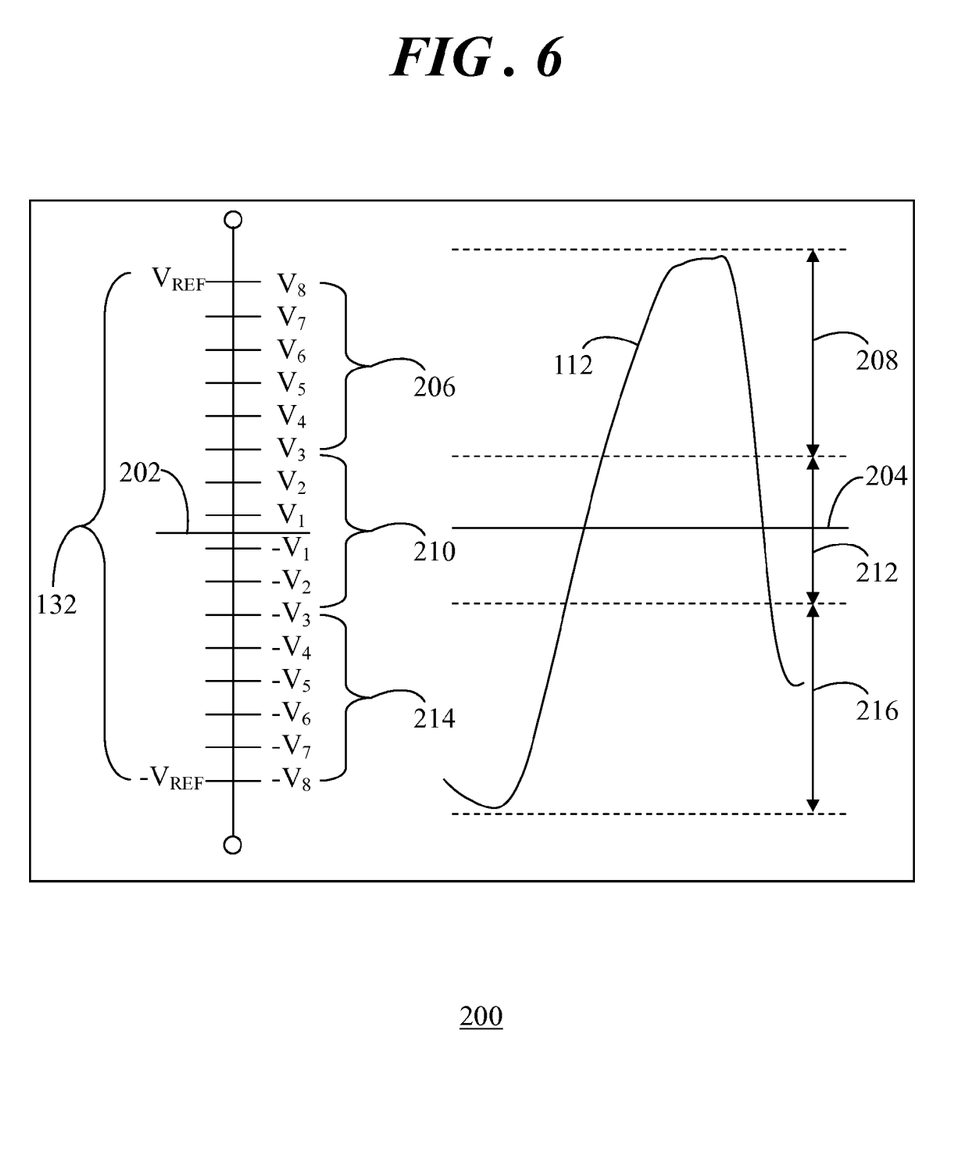
FIG. 6 shows a chart exemplifying reference voltages that may be utilized in connection with a quantizer, according to an exemplary embodiment.

FIG. 6 shows a chart 200 exemplifying reference voltages 202 that may be utilized in connection with a quantizer, e.g., quantizer 110 (FIG. 4), according to an exemplary embodiment. Chart 200 will be described in connection with resistive ladder network 118 (FIG. 4). However, the following discussion applies equivalently to resistive ladder network 120. Input reference voltage 124 (FIG. 4) provided by voltage source 128 (FIG. 4) is dropped across the series of resistors 130 (FIG. 4) to generate a plurality of reference voltages 132. In this example, sixteen reference voltages 132, i.e., sixteen different voltage levels (represented by $V_8$ through $-V_8$ in chart 200) are generated. Each distinct reference voltage 132 is input into its corresponding one of comparators 122 (FIG. 4).

In this example, reference voltages 132 are centered at a mid-point which is approximately zero volts. That is, an equivalent quantity of reference voltages 132 are above a midline 202 corresponding to zero volts 204, and an equivalent quantity of reference voltages 132 are below midline 202. A first set 206 of reference voltages 132 corresponds to an upper voltage range 208 for input signal 112, $V_{IN-P}$. A second set 210 of reference voltages 132 corresponds to a middle voltage range 212 for input signal 112, and a third set 214 of reference voltages 132 corresponds to a lower voltage range 216 for input signal 112. Although reference voltages 132 are centered at a midline that corresponds to zero volts, it should be understood that the reference voltages 132 need not be centered at zero volts, but could instead be centered at the midline of any voltage range determined by particular design requirements for the quantizer.

In an embodiment, middle voltage range 212 is centered at approximately zero volts 204, with upper voltage range 208 including analog voltage values that are greater than the analog voltage values included in middle voltage range 206 and lower voltage range 216 including analog voltage values that are less than the analog voltage values include in middle voltage range 206. Accordingly, second set 210 of reference voltages 132 is centered at approximately zero mark 202, with first set 206 of reference voltages 132 being above, i.e., greater than second set 210, and third set 214 of reference voltages 132 being below, i.e., less than second set 210.

Feed-through can be a significant source of error in quantizers. Capacitive feed-through of the input signal, e.g., input signal 112, to the voltage reference network can cause the reference voltage at each tap or node of the voltage reference network to change substantially from its nominal DC value, degrading the converter performance. In general, a voltage reference network, such as resistive ladder network 118 (FIG. 4), used to generate reference voltage 132 has the highest feed-through at the middle of the ladder and the lowest feed-through at the lower and upper part of the ladder. That is, feed-through of analog input signal 112 at nodes 218 (see also FIG. 4) of resistive ladder network 118 (FIG. 4) corresponding to upper voltage range 208 and lower voltage range 216 is negligible due to proper decoupling. However, maximum feed-through of analog input signal 112 will occur at nodes 218 corresponding to middle voltage range 212. Therefore, most of the drop in SNDR 196 (FIG. 5) occurs because of the middle range of the network, i.e., at second set of reference voltages 210, corresponding to middle voltage range 212 of analog input signal 112.

Accordingly, quantizer 110 is optimized such that second subset 138 (FIG. 4) of comparators 122 (FIG. 4) having the higher accuracy preamplifier stage 150 are configured to compare input signal 112 with second set 210 of reference voltages 132 associated with middle voltage range 212. Additionally, quantizer 110 is optimized such that first subset 136 (FIG. 4) of comparators 122 having the lower power consumption first switched capacitor stage 142 is configured to compare input signal 112 with first set 206 of reference voltages 132 associated with upper voltage range 208. Likewise, third subset 140 (FIG. 4) of comparators 122 having the lower power consumption second switched capacitor stage 158 is configured to compare input signal 112 with third set 214 of reference voltages associated with lower voltage range 216.

This optimized configuration of quantizer 110 (FIG. 4), relative to prior art quantizers having only preamplifier based comparators and relative to prior art quantizers having only switched capacitor based comparators, can meet stringent SNR and SNDR requirements while minimizing power consumption.

Figure 7:
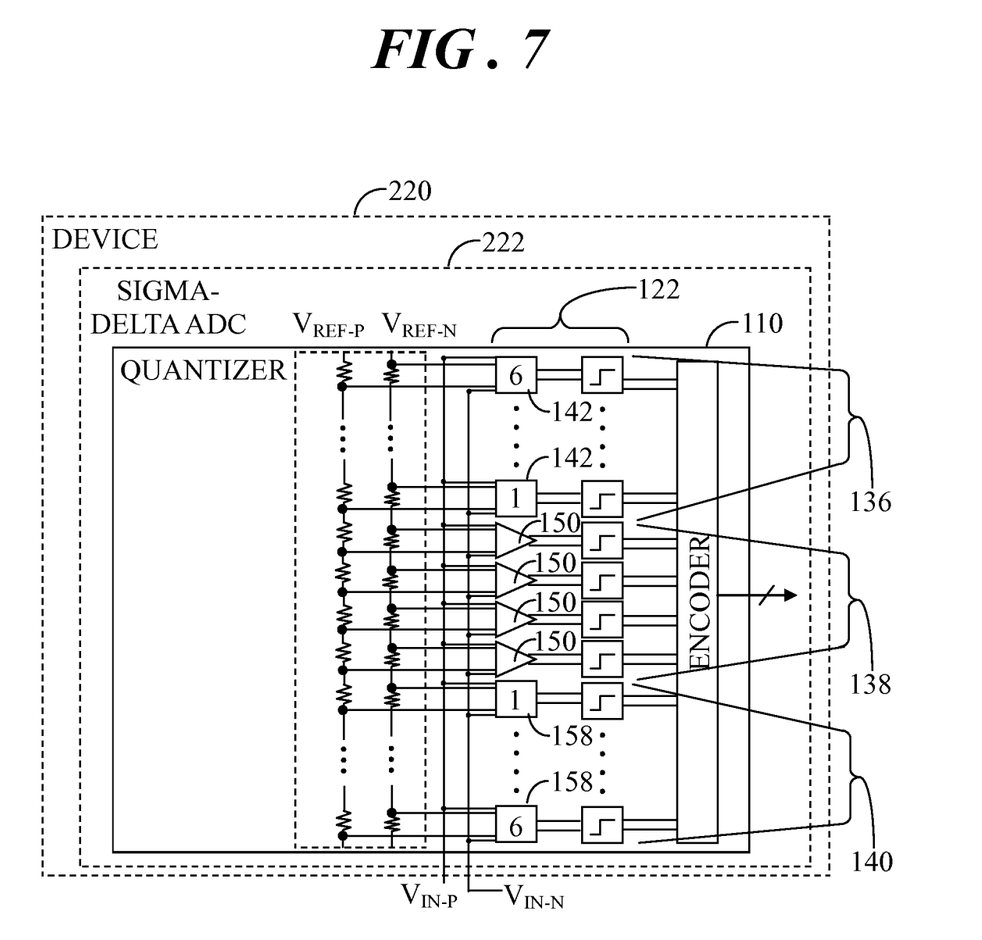
FIG. 7 shows a simplified schematic of a device that includes a CT sigma delta ADC, according to an exemplary embodiment.

FIG. 7 shows a simplified schematic of a device 220 that includes CT sigma delta ADC 222, according to an exemplary embodiment. CT sigma delta ADC 222 may be similar to the architecture of CT sigma delta ADC 20 (FIG. 1) discussed above. As such, CT sigma delta ADC 222 may include loop filter 32, clock 45, DEM circuit 50, and DAC 52. Accordingly, various components of CT sigma delta ADC 222 will not be repeated herein for brevity.

CT sigma delta ADC 222 includes quantizer 110. Accordingly, the components of quantizer 110 will not be repeated herein for brevity. In an embodiment, quantizer 110 comprises a second order, four bit quantizer ($2^4$). As such CT sigma delta ADC 222 includes a quantizer 110 with a total of sixteen comparators 122. The architecture of quantizer 110 entails six (1 . . . 6) comparators 122, i.e., having first switched capacitor stage 142 in first subset 136, four comparators 122, i.e., having preamplifier stage 150 in second subset 138, and six (1 . . . 6) comparators 122, i.e., having second switched capacitor stage 158 in third subset 140. The second order, four bit configuration of quantizer 110 that includes six switched based comparators at each of upper and lower voltage ranges 208 and 216 (FIG. 6) and four preamplifier based comparators at middle voltage range 212 represents a reasonable compromise between power consumption and achieved SNR/SNDR for quantizer 110. In other embodiments, second subset 138 may include more or fewer than one fourth of the total number of comparators 122, and correspondingly, first and third subsets 136, 140 may have fewer or more than three fourths of the total number of comparators 122. In addition, in other embodiments, the number of comparators 122 in the first and third subsets 136, 140 may be unequal.

In one or more embodiments of the present invention, an example configuration is described that implements a second-order feedback type structure which uses sixteen comparators, and the quantization level is thus 16 bits. However, a delta-sigma modulation circuit to which a low-power-consumption, high accuracy quantizer, having a suitable combination of switched capacitor based comparators and preamplifier based comparators, is not limited. Therefore, any system may be employed, regardless of the structure of a loop filter (feed-forward type, feedback type, or cascade type), transmission characteristic (low-pass type, or band-pass type), order of the filter, or the quantization level.

Figure 8:
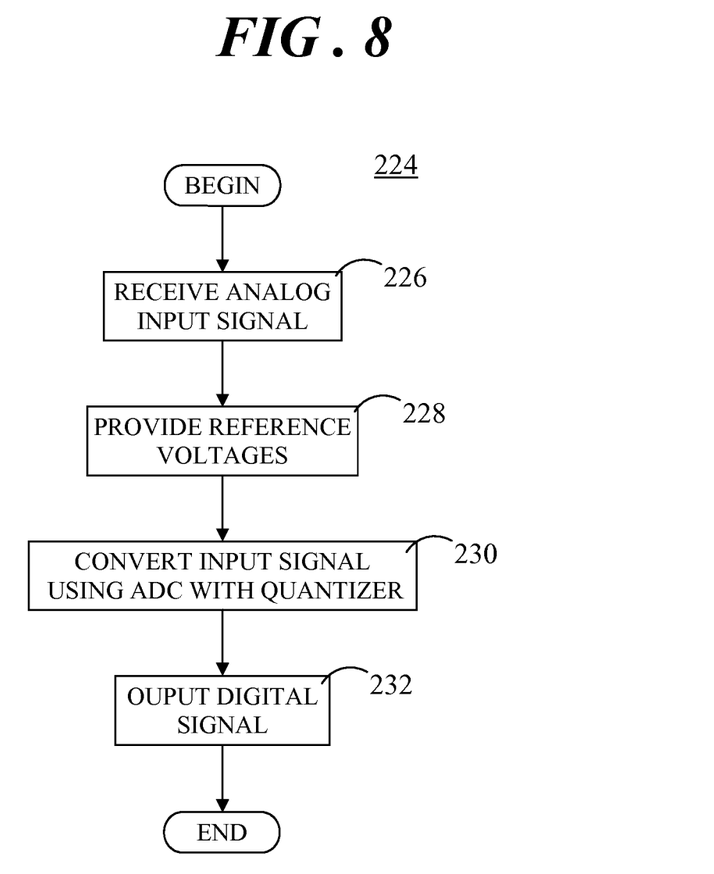
FIG. 8 shows a flowchart of a method for performing analog-to-digital conversion, according to an exemplary embodiment.

FIG. 8 shows a flowchart of a method 224 of performing analog-to-digital conversion, according to an exemplary embodiment. As the various method steps depicted in FIG. 8 have been described in more detail above, the below discussion should be considered a summary of the method, and the various embodiment details discussed above apply to the discussion of the method steps of FIG. 8.

The method begins, in block 226, when an input signal (e.g., input signals 112, 114, FIG. 4) are received at each of a set of comparators within a quantizer (e.g., comparators 122 of quantizer 110 which include first, second, and third subsets 136, 138, and 140 of comparators, FIG. 4). In block 228, a plurality of reference voltages are provided to the comparators via resistive ladder networks (e.g., reference voltages 132, 134 provided by resistive ladder networks 118, 120, FIG. 4).

In block 230, the input signal is converted to a sequence of digital samples using an ADC that includes a quantizer (e.g., CT sigma delta ADC 22 including quantizer 110, where quantizer 110 includes first and third subsets 136, 140 of switched capacitor based comparators 122 and second subset 138 of preamplifier based comparators 122, FIG. 4 and FIG. 7). In block 232, the sequence of digital samples is output from the quantizer (e.g., digital value 116, $V_{OUT-D}$ output from encoder 182, FIG. 4). According to an embodiment, the method may continuously be performed, and in other embodiments, the method may be selectively disabled.

It is to be understood that certain ones of the process blocks depicted in FIG. 8 may be performed in parallel with each other or with performing other processes. In addition, it is to be understood that the particular ordering of the process blocks depicted in FIG. 8 may be modified, while achieving substantially the same result. Accordingly, such modifications are intended to be included within the scope of the inventive subject matter. In addition, although particular system configurations are described in conjunction with FIGS. 4-7, above, embodiments may be implemented in systems having other architectures, as well. These and other variations are intended to be included within the scope of the inventive subject matter.

Thus, various embodiments of a quantizer, an analog-to-digital converter, and methods of their operation have been described. An embodiment of a quantizer comprises a voltage reference network configured to generate a plurality of reference voltages, and a set of comparators coupled with the voltage reference network. Each of the comparators is configured to receive an input signal and produce a sequence of digital samples. The set of comparators includes a first subset of comparators, each comparator of the first subset including a first switched capacitor stage, a second subset of comparators, each comparator of the second subset including a preamplifier stage, and a third subset of comparators, each comparator of the third subset including a second switched capacitor stage.

An embodiment of an analog-to-digital converter (ADC) comprises an analog loop filter having an input for receiving an input signal of the ADC and producing a filtered input signal from the input signal, and a quantizer having an input coupled to an output of the loop filter, wherein the quantizer quantizes the filtered input signal from the loop filter to produce a sequence of digital samples. The quantizer includes a voltage reference network configured to generate a plurality of reference voltages, and a set of comparators coupled with the voltage reference network, each of the comparators being configured to receive the filtered input signal. The set of comparators comprises first, second, and third subsets of comparators. Each comparator of the first subset includes a first switched capacitor stage and a first latch stage coupled to a first output of the first switched capacitor stage. Each comparator of the second subset includes a preamplifier stage and a second latch stage coupled to a second output of the preamplifier stage. Each comparator of the third subset includes a second switched capacitor stage and a third latch stage coupled to a third output of the second switched capacitor stage.

An embodiment of a method of performing analog-to-digital conversion using an analog-to-digital converter (ADC) also is disclosed, where the ADC comprises a quantizer, the quantizer comprises a voltage reference network and a set of comparators coupled with the voltage reference network, wherein the set of comparators includes first, second, and third subsets of comparators, each comparator of the first subset including a first switched capacitor stage, each comparator of the second subset including a preamplifier stage, and each comparator of the second subset including a second switched capacitor stage, and the method includes receiving an input signal at each of the comparators, and providing a plurality of reference voltages to the comparators via the voltage reference network, one each of the reference voltages being associated with one each of the comparators. The method further includes converting the input signal into a sequence of digital samples using the ADC. The converting operation includes comparing, at the each comparator of the first subset, the input signal with one of the reference voltages from a first set of the reference voltages, the first set of the reference voltages corresponding to an upper voltage range of the input signal. The converting operation further includes comparing, at the each comparator of the second subset, the input signal with one of the reference voltages from a second set of the reference voltages, the second set of the reference voltages corresponding to a middle voltage range of the input signal. And, the converting operation further includes comparing, at the each comparator of the third subset, the input signal with one of the reference voltages from a third set of the reference voltages, the third set of the reference voltages corresponding to a lower voltage range of the input signal, wherein the middle voltage range is centered at approximately zero volts, the upper voltage range is greater than the middle voltage range, and the lower voltage range is less than the middle voltage range.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A quantizer comprising:
   a voltage reference network configured to generate a plurality of reference voltages; and
   a set of comparators coupled with said voltage reference network, each of said comparators being configured to receive an input signal and produce a sequence of digital samples, wherein said set of comparators comprises:
   a first subset of comparators, each comparator of said first subset including a first switched capacitor stage;
   a second subset of comparators, each comparator of said second subset including a preamplifier stage; and
   a third subset of comparators, each comparator of said third subset including a second switched capacitor stage.

2. A quantizer as claimed in claim 1 wherein:
   said first subset of comparators is configured to compare said input signal with a first set of reference voltages, said first set of reference voltages corresponding to an upper voltage range of said input signal;
   said second subset of comparators is configured to compare said input signal with a second set of reference voltages, said second set of reference voltages corresponding to a middle voltage range of said input signal; and
   said third subset of comparators is configured to compare said input signal with a third set of reference voltages, said third set of reference voltages corresponding to a lower voltage range of said input signal.

3. A quantizer as claimed in claim 2 wherein said upper voltage range is greater than said middle voltage range, and said lower voltage range is less than said middle voltage range.

4. A quantizer as claimed in claim 2 wherein said middle voltage range is centered at approximately zero volts.

5. A quantizer as claimed in claim 1 wherein:
said voltage reference network includes a series of resistors; and
said quantizer further comprises a voltage source coupled to said voltage reference network for providing a reference voltage to said voltage reference network, said reference voltage being dropped across said resistors of said series to generate said plurality of reference voltages.

6. A quantizer as claimed in claim 5 wherein said plurality of reference voltages is centered at approximately zero volts.

7. A quantizer as claimed in claim 1 wherein:
said each comparator of said first subset further includes a first latch stage coupled to a first output of said first switched capacitor stage, each said first latch stage being configured to perform a latching operation on a first output signal from said first output of said first switched capacitor stage;
said each comparator of said second subset further includes a second latch stage coupled to a second output of said preamplifier stage, each said second latch stage is configured to perform said latching operation on a second output signal from said second output of said preamplifier stage; and
said each comparator of said third subset further includes a third latch stage coupled to a third output of said second switched capacitor stage, each said third latch stage is configured to perform said latching operation on a third output signal from said third output of said second switched capacitor stage.

8. A quantizer as claimed in claim 1 wherein each comparator of said set of comparators is configured as a differential circuit.

9. A quantizer as claimed in claim 1 wherein said quantizer comprises a second order, four bit quantizer.

10. A quantizer as claimed in claim 9 wherein said set of comparators for said second order, four bit quantizer includes sixteen comparators, said first subset of comparators includes six of said sixteen comparators, said second subset of comparators includes four of said sixteen comparators, and said third subset of comparators includes six of said sixteen comparators.

11. An analog-to-digital converter (ADC) comprising:
an analog loop filter having an input for receiving an input signal of said ADC and producing a filtered input signal from said input signal; and
a quantizer having an input coupled to an output of said loop filter, wherein said quantizer quantizes said filtered input signal from said loop filter to produce a sequence of digital samples, said quantizer comprising:
a voltage reference network configured to generate a plurality of reference voltages; and
a set of comparators coupled with said voltage reference network, each of said comparators being configured to receive said filtered input signal, wherein said set of comparators comprises first, second, and third subsets of comparators, each comparator of said first subset including a first switched capacitor stage and a first latch stage coupled to a first output of said first switched capacitor stage, each comparator of said second subset including a preamplifier stage and a second latch stage coupled to a second output of said preamplifier stage, and each comparator of said third subset including a second switched capacitor stage and a third latch stage coupled to a third output of said second switched capacitor stage.

12. An ADC as claimed in claim 11 wherein said ADC comprises a continuous-time sigma delta ADC.

13. An ADC as claimed in claim 11 wherein:
said first subset of comparators is configured to compare said filtered input signal with a first set of reference voltages, said first set of reference voltages corresponding to an upper voltage range of said filtered input signal;
said second subset of comparators is configured to compare said filtered input signal with a second set of reference voltages, said second set of reference voltages corresponding to a middle voltage range of said filtered input signal; and
said third subset of comparators is configured to compare said filtered input signal with a third set of reference voltages, said third set of reference voltages corresponding to a lower voltage range of said filtered input signal.

14. An ADC as claimed in claim 13 wherein said upper voltage range is greater than said middle voltage range, and said lower voltage range is less than said middle voltage range.

15. An ADC as claimed in claim 11 wherein:
said voltage reference network includes a series of resistors; and
said quantizer further comprises a voltage source coupled to said voltage reference network for providing a reference voltage to said voltage reference network, said reference voltage being dropped across said resistors of said series to generate said plurality of reference voltages.

16. An ADC as claimed in claim 15 wherein said plurality of reference voltages is centered at approximately zero volts.

17. An ADC as claimed in claim 11 wherein:
each said first latch stage of said first subset of comparators is configured to perform a latching operation on a first output signal from said first output of said first switched capacitor stage;
each said second latch stage of said second subset of comparators is configured to perform said latching operation on a second output signal from said second output of said preamplifier stage; and
each said third latch stage of said third subset of comparators is configured to perform said latching operation on a third output signal from said third output of said second switched capacitor stage.

18. An ADC as claimed in claim 11 wherein said quantizer comprises a second order, four bit quantizer, said set of comparators for said second order, four bit quantizer includes sixteen comparators, said first subset of comparators includes six of said sixteen comparators, said second subset of comparators includes four of said sixteen comparators, and said third subset of comparators includes six of said sixteen comparators.

19. A method of performing analog-to-digital conversion using an analog-to-digital converter (ADC), said ADC comprising a quantizer, said quantizer comprising a voltage reference network and a set of comparators coupled with said voltage reference network, and said method comprises:
receiving an input signal at each of said comparators, wherein said set of comparators includes first, second, and third subsets of comparators, each comparator of said first subset including a first switched capacitor stage, each comparator of said second subset including a preamplifier stage, and each comparator of said third subset including a second switched capacitor stage;

providing a plurality of reference voltages to said comparators via said voltage reference network, one each of said reference voltages being associated with one each of said comparators;

converting said input signal into a sequence of digital samples using said ADC, said converting operation including:

comparing, at said each comparator of said first subset, said input signal with one of said reference voltages from a first set of said reference voltages, said first set of said reference voltages corresponding to an upper voltage range of said input signal;

comparing, at said each comparator of said second subset, said input signal with one of said reference voltages from a second set of said reference voltages, said second set of said reference voltages corresponding to a middle voltage range of said input signal; and comparing, at said each comparator of said third subset, said input signal with one of said reference voltages from a third set of said reference voltages, said third set of said reference voltages corresponding to a lower voltage range of said input signal, wherein said upper voltage range is greater than said middle voltage range, and said lower voltage range is less than said middle voltage range.

20. A method as claimed in claim 19 wherein said converting operation further comprises:

performing a latching operation on a first output signal from a first output of said first switched capacitor stage, wherein each comparator of said first subset further includes a first latch stage coupled to said first output of said first switched capacitor stage such that said performing operation is performed at each said first latch stage;

performing said latching operation on a second output signal from a second output of said preamplifier stage, wherein each comparator of said second subset further includes a second latch stage coupled to said second output of said preamplifier stage such that said performing operation is performed at each said second latch stage; and performing a latching operation on a third output signal from a third output of said second switched capacitor stage, wherein each comparator of said third subset further includes a third latch stage coupled to said third output of said second switched capacitor stage such that said performing operation is performed at each said third latch stage.

* * * * *